US006251802B1

(12) United States Patent
Moore et al.

(10) Patent No.: US 6,251,802 B1
(45) Date of Patent: Jun. 26, 2001

(54) METHODS OF FORMING CARBON-CONTAINING LAYERS

(75) Inventors: John T. Moore; Guy T. Blalock; Scott Jeffrey DeBoer, all of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/175,051

(22) Filed: Oct. 19, 1998

(51) Int. Cl.[7] ................................................. H01L 21/31
(52) U.S. Cl. ........................ 438/778; 438/623; 438/766; 438/780; 438/783; 438/924
(58) Field of Search ................................. 438/778, 780, 438/505, 506, 623, 624, 766, 783, 924

(56) References Cited

U.S. PATENT DOCUMENTS

| | | | |
|---|---|---|---|
| 3,855,009 | * 12/1974 | Lloyd et al. | 438/480 |
| 5,045,356 | * 9/1991 | Uemura et al. | 427/249.2 |
| 5,286,344 | 2/1994 | Blalock et al. | 156/657 |
| 5,441,901 | * 8/1995 | Candelaria | 438/317 |
| 5,661,093 | * 8/1997 | Ravi et al. | 438/763 |
| 5,756,391 | * 5/1998 | Tsuchiaki | 438/592 |
| 6,025,273 | * 2/2000 | Chen et al. | 438/706 |

OTHER PUBLICATIONS

Sakata et al. Amorphous silicon/amorphous silicon carbide heterojunctions applied to memory device structures, Apr. 28, 1994, Electronic Letters, vol. 30, No. 9, pp. 688–689.*

Singh et al. "Porous silicon oxycarbide glasses", Oct. 1996, J. Am. Ceram. Soc., pp. 2696–2704.*

* cited by examiner

Primary Examiner—Stephen D. Meier
Assistant Examiner—Maria Guerrero
(74) Attorney, Agent, or Firm—Wells, St. John, Roberts, Gregory & Matkin, P.S.

(57) ABSTRACT

In one aspect, the invention includes an etching process, comprising: a) providing a first material over a substrate, the first material comprising from about 2% to about 20% carbon (by weight); b) providing a second material over the first material; and c) etching the second material at a faster rate than the first material. In another aspect, the invention includes a capacitor forming method, comprising: a) forming a wordline over a substrate; b) defining a node proximate the wordline; c) forming an etch stop layer over the wordline, the etch stop layer comprising carbon; d) forming an insulative layer over the etch stop layer; e) etching through the insulative layer to the etch stop layer to form an opening through the insulative layer; and e) forming a capacitor construction comprising a storage node, dielectric layer and second electrode, at least a portion of the capacitor construction being within the opening. In yet another aspect, the invention includes a semiconductive material assembly, comprising: a) a semiconductive substrate; and b) a layer over the semiconductive substrate, the layer comprising silicon, nitrogen and carbon.

2 Claims, 11 Drawing Sheets

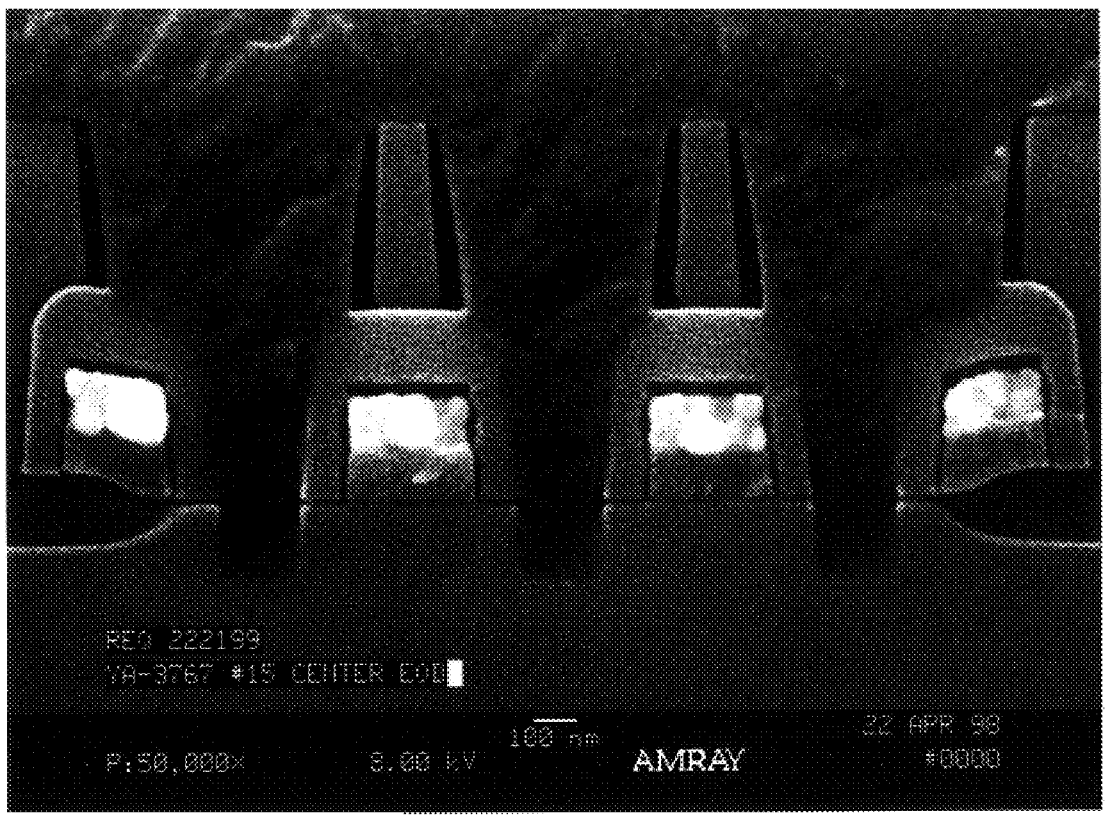

METHODS OF FORMING CARBON-CONTAINING LAYERS

TECHNICAL FIELD

The invention pertains to etching processes and semiconductive material assemblies, and has particular application to capacitors and DRAMS, as well as to methods of forming capacitors and DRAMs.

BACKGROUND OF THE INVENTION

Modern semiconductor device fabrication processes frequently utilize selective etching conditions during fabrication of semiconductor devices. Selective etching conditions will etch one material more rapidly than another. The material that is etched most rapidly can be referred to as a sacrificial material, and that which is etched less rapidly can be referred to as a protective (or etch stop) material. Selective etching can be utilized in, for example, processes in which it is desired to protect a portion of a semiconductive wafer from etching conditions while etching through another portion of the wafer. Example selective etching conditions are dry etch conditions selective for etching silicon oxide relative to silicon nitride. Such example selective etching conditions are described in U.S. Pat. No. 5,286,344, which is hereby incorporated by reference.

Many selective etching methods currently practiced generally have selectivities of about 10:1 or less. In other words, the etch conditions will selectively etch a first (sacrificial) material at a rate that is less than or equal to about twice as fast as that at which a second (protective) material is etched. At selectivities of 10:1 or less, there is a constant risk that the protective material will be etched entirely away during the etching of the sacrificial material. Accordingly, it would be desirable to develop alternative methods of selective etching having selectivities of greater than 10:1.

A possible mechanism by which selectivity can occur is through selective polymer formation on the protective material during etching of it and the sacrificial material. For instance, etching of silicon oxide and silicon nitride under conditions such as those described in U.S. Pat. No. 5,286,344 may create a carbonaceous polymer on the silicon nitride which protects the silicon nitride during etching of the silicon oxide. The carbon contained in the carbonaceous polymer can originate is from, for example, etchant materials (either gas, liquid or plasma materials), such as, for example, the $CH_2F_2$ and $CHF_3$ described in U.S. Pat. No. 5,286,344. When silicon oxide, such as BPSG is selectively etched relative to silicon nitride, the carbon will frequently originate at least in part from etching of the BPSG. Thus, less selectivity is obtained when less BPSG is etched relative to an amount of silicon nitride exposed to the etching conditions. Accordingly, thin layers of BPSG can be more difficult to etch than thicker layers. Many selective etching methods are non-effective for selectively etching BPSG relative to silicon nitride when the BPSG layers have thicknesses of less than or equal to about 1.3 microns.

An exemplary application of selective etching is a dynamic random access memory (DRAM) forming process. Referring to FIG. 1, a DRAM construction is illustrated with respect to a semiconductive wafer fragment 10. Wafer fragment 10 comprises a substrate 12. Substrate 12 can be, for example, a monocrystalline wafer lightly doped with a p-type background dopant. To aid in interpretation of the claims that follow, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Field oxide regions 15 overlie substrate 12, and node locations 14, 16, and 18 are between the field oxide regions. The node locations contain diffusion regions conductively doped with a conductivity-enhancing dopant.

Wordlines 20 and 22 overlie over substrate 12. Wordlines 20 and 22 comprise a gate oxide layer 24 and a conductive layer 26. Gate oxide layer 24 can comprise, for example, silicon dioxide. Conductive layer 26 can comprise, for example, conductively doped polysilicon capped with a metal silicide, such as, for example, tungsten silicide or titanium silicide. Wordlines 20 and 22 have opposing sidewall edges, and sidewall spacers 28 and 30 extend along such sidewall edges. An etch stop layer 32 extends over wordlines 20 and 22. Etch stop layer 32 can comprise, for example, silicon nitride. Although not shown, an insulative layer may be placed between etch stop layer 32 and conductive layer 26. Such insulative layer can comprise, for example, silicon oxide or silicon nitride.

An insulative layer 34 is provided over substrate 12 and over wordlines 20 and 22. Insulative layer 34 can comprise, for example, borophosphosilicate glass (BPSG).

Capacitor constructions 36 and 38 extend through insulative layer 34 to contact node locations 14 and 18, respectively. Capacitor constructions 36 and 38 comprise a storage node (first electrode) 40, a dielectric layer 42, and a second electrode 44. Storage node 40 and second electrode 44 can comprise, for example, conductively doped silicon such as conductively doped polysilicon. Dielectric layer 42 can comprise, for example, silicon dioxide and/or silicon nitride. Although all of layers 40, 42 and 44 are shown extending within openings in layer 34, it is noted that other capacitor constructions are known wherein some or none of the storage node, dielectric, and second electrode layers extend within an opening.

A bit line contact 46 also extends through insulative layer 34, and contacts node location 16. Bit line contact 46 is in gated electrical connection with capacitor construction 36 through wordline 20, and in gated electrical connection with capacitor 38 through wordline 22. Bit line contact 46 can comprise, for example, tungsten, titanium, and/or titanium nitride. Although not shown, a diffusion barrier layer, such as, for example, titanium nitride, can be formed between bit line contact 46 and the diffusion region of node location 16.

A second insulative layer 48 extends over capacitor constructions 36 and 38, and electrically isolates second electrodes 44 from bit line contact 46. Second insulative layer 48 can comprise the same material as first insulative layer 34. Second insulative layer 48 can comprise, for example, silicon dioxide, BPSG, or silicon nitride.

A bit line 50 extends over second insulative layer 48 and in electrical connection with bit line contact 46. Accordingly, bit line contact 46 electrically connects bit line 50 to node location 16. Bit line 50 can comprise, for example, aluminum, copper, or an alloy of aluminum and copper.

A method of forming the DRAM construction of FIG. 1 is described with reference to FIGS. 2–3. FIG. 2 illustrates semiconductive wafer fragment 10 at a preliminary processing step. Etch stop layer 32 extends over wordlines 20 and 22, and over node locations 14, 16 and 18. Insulative layer 34 extends over etch stop layer 32, and a patterned photoresist masking layer 60 is provided over insulative layer 34. Patterned photoresist layer 60 defines an opening 62 which is to be extended to node location 16 for ultimate formation of bit line contact 46 therein.

Referring to FIG. 3, opening 62 is extended to etch stop layer 32. The etch utilized to extend opening 62 is preferably selective for the material of layer 34 relative to that of layer 32. For instance, if layer 34 comprises BPSG and layer 32 comprises nitride, the etch can utilize a fluorocarbon material such as one or more of the materials disclosed in U.S. Pat. No. 5,286,344.

After selectively etching to layer 32, subsequent anisotropic etching of layer 32 can occur to extend opening 62 to node location 16. Such extended opening can be described to as a "self-aligned contact opening", referring to the fact that the opening is aligned with sidewall edges of wordlines 20 and 22.

After opening 62 is extended to node location 16, photoresist layer 60 (FIG. 2) can be removed, and subsequent processing utilized for forming bit line contact 46 within opening 62. Also, similar etching described above for formation of bit line contact opening 62 can be utilized to form openings to node locations 14 and 18 for formation of capacitor constructions 36 and 38, respectively, therein. In the shown fabrication process, bit line contact opening 62 is formed prior to forming openings for capacitor constructions 36 to 38. However, other fabrication processes are known wherein openings for the capacitor constructions are formed either before, or simultaneously with, formation of the opening for the bit line contact.

FIG. 3 illustrates an idealized selective etch, wherein the etch stops substantially entirely upon reaching etch stop layer 32. However, as discussed above, prior art etching processes are typically only about two times more selective for sacrificial materials (the material of layer 34) than for protective materials (the material of layer 32). Accordingly, the selective etches do not generally stop substantially entirely upon reaching etch stop layer 32, but rather continue at a slower rate upon reaching layer 32.

FIG. 4 illustrates a prior art problem which can occur as a result of the continued etching of layer 32. Specifically, layer 32 can become thinned to an extent that one or both of sidewalls 28 and 30 are exposed to the etching conditions. Such exposure can lead to etching through the sidewall spacers to expose conductive material 26. In a particularly bad scenario, conductive layer 26 is then shorted to bit line contact 46 when the conductive material of bit line contact 46 is formed within opening 62. Also, the thinning of etch stop layer 32 can lead to unpredictability during a subsequent etch of layer 32 to expose node location 16. Specifically, it is unknown how long to continue a subsequent etch. If the etch continues for too long the etch can undesirably penetrate into substrate 12, and possibly through the diffusion region at node location 16.

For the above-discussed reasons, it is desired to develop alternative methods for selectively etching materials wherein the selectivity of an etch for a given material is improved.

SUMMARY OF THE INVENTION

In one aspect, the invention encompasses an etching process. A first material is provided over a substrate. The first material comprises from about 2% to about 20% carbon (by weight). A second material is provided over the first material. The second material is etched at a faster rate than the first material.

In another aspect, the invention encompasses a capacitor forming method. A wordline is formed over a substrate and has a sidewall. An insulative spacer is formed along the sidewall. A node is defined proximate the wordline. An etch stop layer is formed over the wordline and over the insulative spacer. At least one of the etch stop layer and the insulative spacer comprises carbon. An insulative layer is formed over the etch stop layer. The insulative layer is etched to form an opening through the insulative layer and to the etch stop layer. A capacitor construction is formed. The capacitor construction comprises a storage node, dielectric layer and a second electrode. At least a portion of the capacitor construction is within the opening.

In yet another aspect, the invention encompasses a DRAM forming method. A pair of wordlines are formed over a substrate. Three nodes are defined proximate the wordlines. The three nodes comprise a first node, second node and third node. The second node is in gated electrical connection with the first node through one of the wordlines and in gated electrical connection with the third node through the other of the wordlines. An etch stop is formed proximate the wordlines. The etch stop comprises carbon. An insulative layer is formed over the etch stop. A first, second and third opening are formed to extend through the insulative layer. The forming the first second and third openings comprises etching through the insulative layer to the etch stop. A first capacitor construction is formed in electrical connection with the first node, a second capacitor construction is formed in electrical connection with the third node, and a bit line contact is formed in electrical connection with the second node.

In other aspects, the invention includes semiconductive material assemblies, capacitor constructions and DRAM constructions.

BRIEF DESCRIPTION OF THE DRAWINGS

Preferred embodiments of the invention are described below with reference to the following accompanying drawings.

FIG. 11 is a scanning electron micrograph of a semiconductor wafer fragment encompassed by the present invention that has been subjected to the same etching condition as the FIG. 10 wafer fragment.

DETAILED DESCRIPTION OF THE PREFERRED EMBODIMENTS

Figure 1:
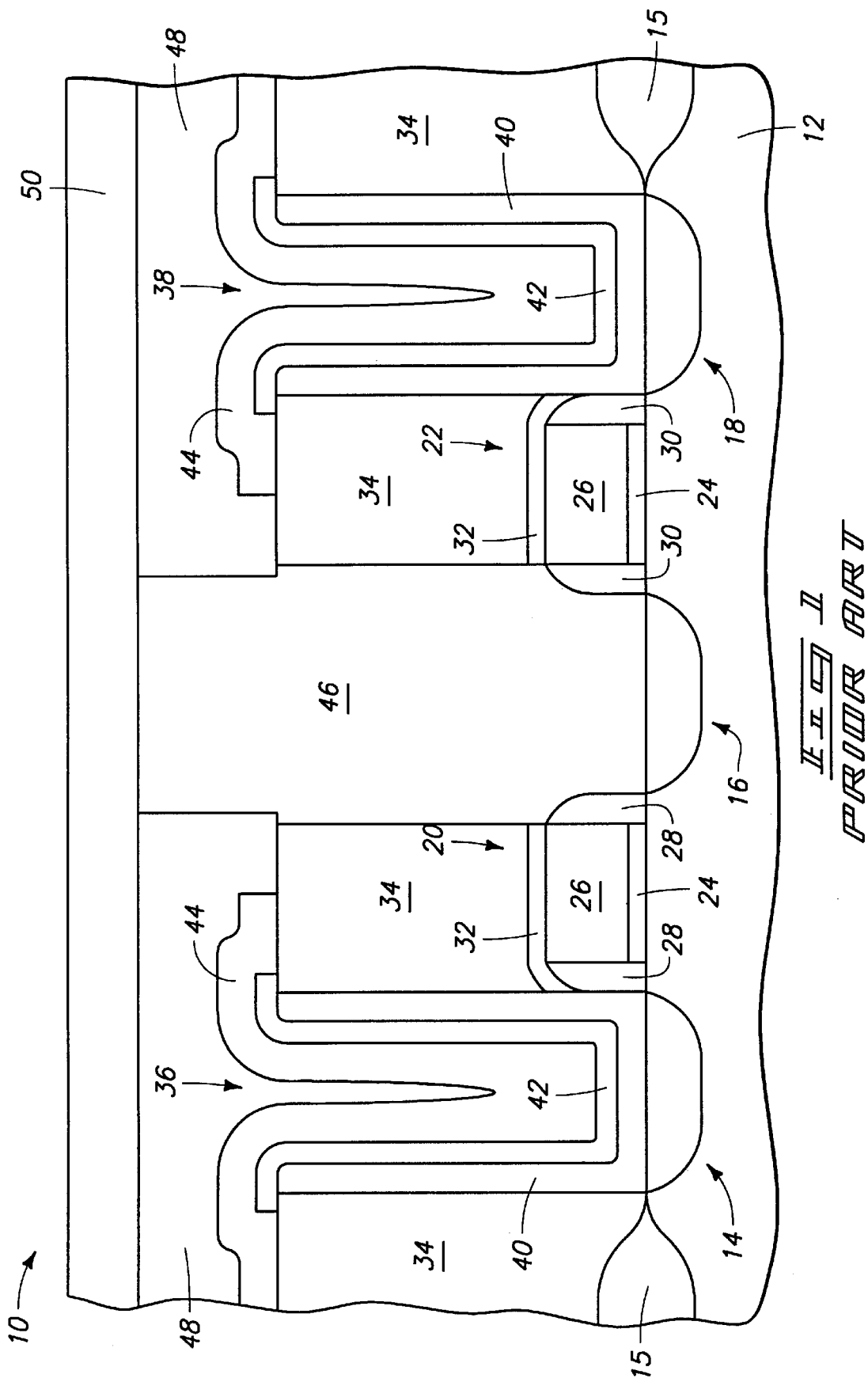
FIG. 1 is a fragmentary, diagrammatic, cross-sectional view of a semiconductive wafer fragment comprising a prior art DRAM assembly.

This disclosure of the invention is submitted in furtherance of the constitutional purposes of the U.S. Patent Laws "to promote the progress of science and useful arts" (Article 1, Section 8).

The present invention encompasses methods of providing carbon within a material to decrease an etch rate of the material. For instance, the present invention encompasses methods of incorporating carbon within a material to decrease an etch rate of the material as it is subjected to an anisotropic dry etching process. In a specific embodiment, the carbon can be provided within a first material to increase a selectivity of an etch of a second material relative to the first material. Exemplary materials within which carbon can be provided are silicon nitride and silicon oxide (such as, for example silicon dioxide or BPSG).

The carbon can be introduced in the form of a carbon-containing gas provided as a precursor during chemical vapor deposition (CVD) of the material within which carbon is desired. Such carbon-containing gas can comprise, for example, one or more of tetraethylorthosilicate (TEOS), bis-(tertiary butyl amino)silane (BTBAS), methane, carbon dioxide, or carbon tetrachloride. In an exemplary application wherein carbon is incorporated into silicon nitride, the silicon nitride can be formed by chemical vapor deposition utilizing dichlorosilane and ammonia, at a temperature of from about 300° C. to about 750° C. and a pressure of from about 50 mTorr to about 2 Torr, and in the presence of an above-discussed carbon-containing gas. In alternative embodiments of the invention, the carbon can be introduced into a material as a carbon implant.

In embodiments in which carbon is incorporated into an insulative material, it is preferably incorporated in an amount of from about 2% to about 20% (by weight), with from about 10% to about 15% being more preferred, and about 10% being yet more preferred. If more than 20% carbon is incorporated into an insulative material, the carbon can degrade insulative properties of the material by forming "leaky holes" extending through the material.

In materials comprising silicon, such as, for example, silicon nitride and silicon oxide, the incorporated carbon can be in the form of silicon carbide (SiC). However, it is noted that this disclosure is to be limited only by the claims that follow, and not by any particular form of incorporated carbon, except to the extent that such is expressly identified in a claim.

The incorporation of carbon into a material can reduce an etch rate of the material by a factor of five or more. In an exemplary application wherein an etch method has a selectivity for silicon oxide relative to silicon nitride of about 2:1 without carbon in the silicon nitride, incorporation of carbon into the nitride layer can increase the selectivity to at least about 10:1. The increase in selectivity occurs through a decrease in the etch rate of silicon nitride. Specifically, prior art methods selective for silicon oxide relative to silicon nitride generally will etch silicon nitride at a rate of at least 10 Å per second. In contrast, incorporation of carbon into the silicon nitride in accordance with the present invention can decrease the etch rate of the silicon nitride to less than or equal to about 5 Å per second while using an otherwise identical selective etch process as the prior art. In preferred exemplary applications, the present invention can decrease the etch rate of the silicon nitride to less than or equal to about 2 Å per second, and in more preferred exemplary applications to about 1.8 Å per second.

While this disclosure is not to be limited to any particular mechanism except to the extent that such is recited in the claims, it is noted that a possible mechanism by which the incorporation of the carbon species can increase process selectivity is to increase an activation energy required by an etching process.

An advantage of the relatively high activation energy films of the present invention relative to the lower activation energy films of the prior art is that lower activation energy films generally require more selective processes than do higher activation energy films. As processing conditions become more highly selective, the processing conditions tend become less stable. Accordingly, since the carbon incorporation of the present invention can enable less selective processing conditions to be utilized to accomplish similar results as obtained in the prior art utilizing more highly selective processing conditions, the present invention can enable more robust processing conditions to be utilized than were utilized in the prior art. Also, the present invention can increase a "process window", to further increase stability of processing conditions. In other words, the carbon incorporation of the present invention can enable a selective process to occur across a broader range of conditions than such process would occur across utilizing prior art methods.

Figure 2:
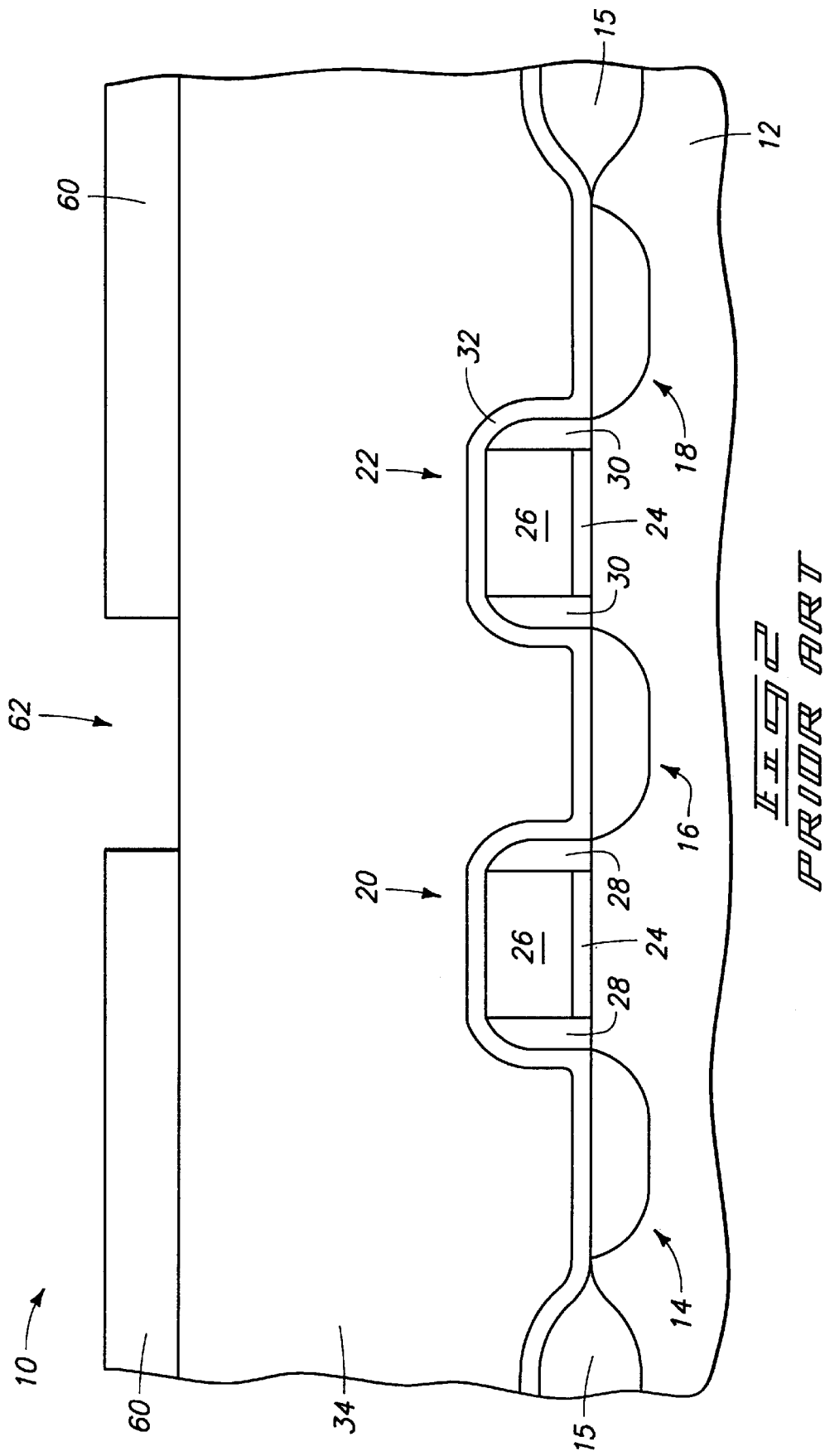
FIG. 2 is a fragmentary, cross-sectional, diagrammatic view of a semiconductive wafer fragment at a preliminary prior art processing step in forming the DRAM construction of FIG. 1.
Figure 3:
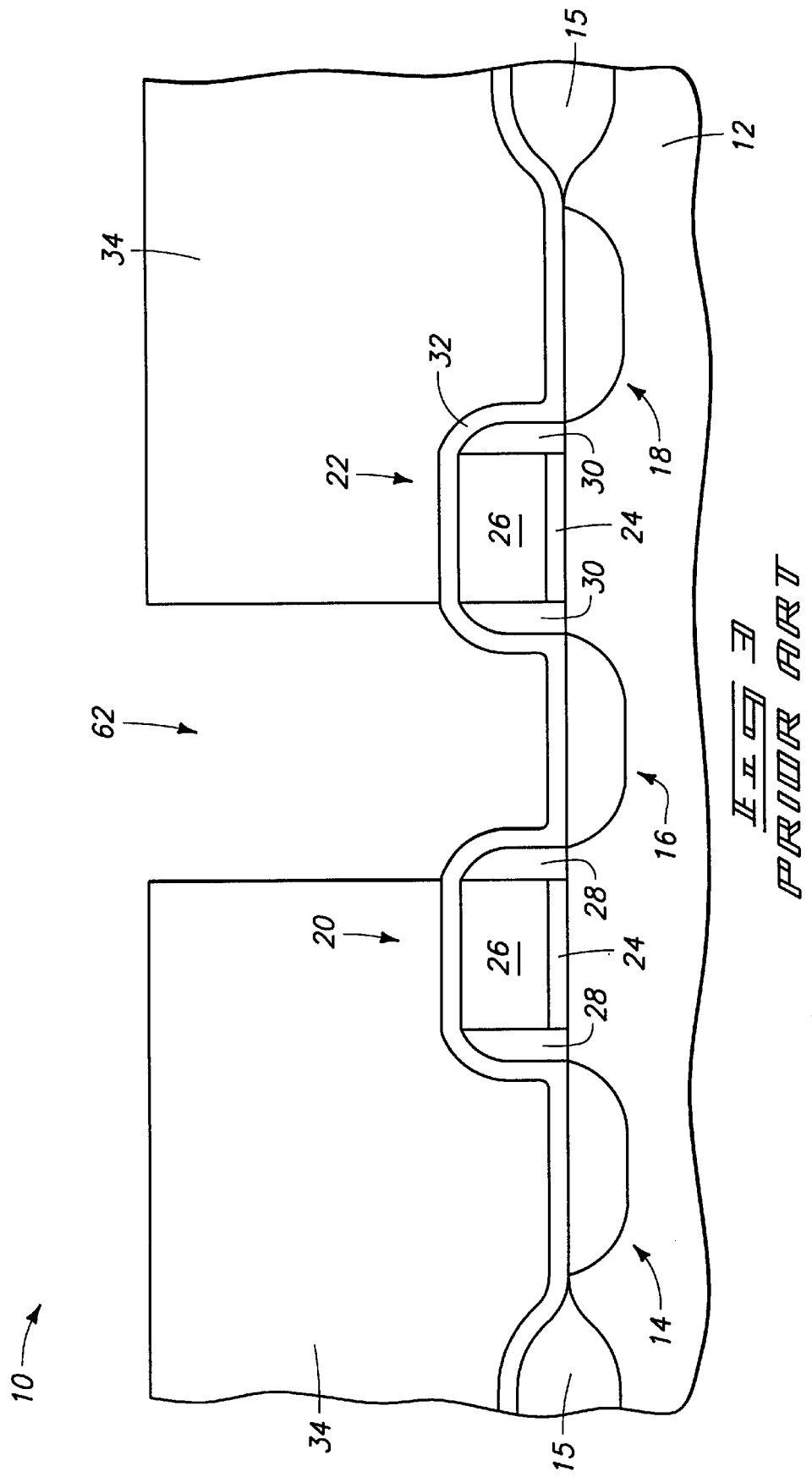
FIG. 3 is a view of the FIG. 2 wafer fragment at a processing step subsequent to that of FIG. 2.

Another advantage of the increased etch selectivity that can be accomplished by methods of the present invention is that it can enable etch stop layers to be made thinner. Specifically, a silicon nitride etch stop layer 32 of FIGS. 1–3 is typically formed to a thickness of at least about 2,000 Angstroms. A reason for the thickness of layer 32 is to compensate for over-etching of the nitride layer 32 that may occur in a selective oxide etch. The enhanced selectivity that can be accomplished by methods of the present invention can enable such thickness to be reduced to less than or equal to about 500 Angstroms without increasing a risk of over-etch. Reduction of the thickness of layer 32 can provide additional room for capacitor constructions (such as constructions 36 and 38 of FIG. 1) in a DRAM structure, enabling more charge to be stored over a given area of semiconductor wafer real estate then is achievable by the prior art method described above with reference to FIGS. 1–3.

Figure 5:
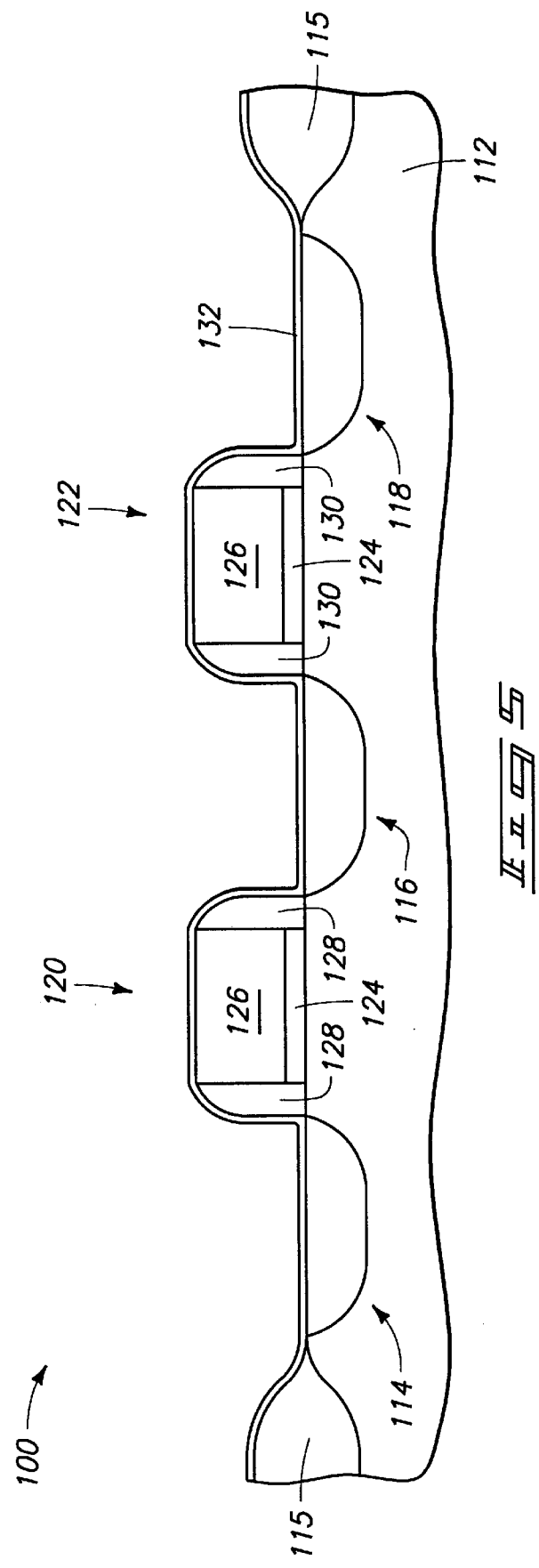
FIG. 5 is a diagrammatic, cross-sectional, fragmentary view of a semiconductor wafer fragment processed according to a method of the present invention.

A method of the present invention is described with reference to FIGS. 5–7. Referring to FIG. 5, a semiconductive wafer fragment 100 comprises a substrate 112 having wordlines 120 and 122 formed thereover. Spacers 128 and 130 extend along sidewalls of wordlines 120 and 122, respectively. Substrate 112, wordlines 120 and 122, and spacers 128 and 130 can comprise constructions identical to those discussed above for substrate 12, wordlines 20 and 22, and spacers 28 and 30 of the prior art. Node locations 114, 116 and 118 are provided between the wordlines and can comprise constructions identical to those discussed above regarding node locations 14, 16, and 18 of the prior art.

An etch stop layer 132 is formed over substrate 112 and over wordlines 120 and 122. In accordance with an aspect of the present invention etch stop layer 132 has carbon incorporated therein. Etch stop layer 132 can comprise, for example, silicon oxide or silicon nitride, and can consist essentially of silicon, nitrogen and carbon, or can consist essential of silicon, oxygen and carbon. For purposes of the discussion that follows, etch stop layer 132 will be referred to as a silicon nitride layer. Portions 115 of nitride layer 132 extend along sidewall spacers 128 and 130. Silicon nitride layer 132 can be formed to a thickness of less than or equal to about 500Å, and can be formed by, for example, chemical vapor deposition of silicon nitride in the presence of BTBAS. Specifically, silicon nitride layer 132 can be deposited in a chemical vapor deposition reactor having a pressure of from about 50 mTorr to about 10 Torr, a temperature of from about 575° C. to about 750° C., a flow rate of $SiH_4$ of from about 0 to about 500 sccm, a flow rate of $NH_3$ of from about 0 to about 2000 sccm, and a flow rate of BTBAS of from about 0 to about 500 sccm, to form silicon nitride layer 132 having from about 2% to about 20% carbon incorporated (by weight).

Figure 4:
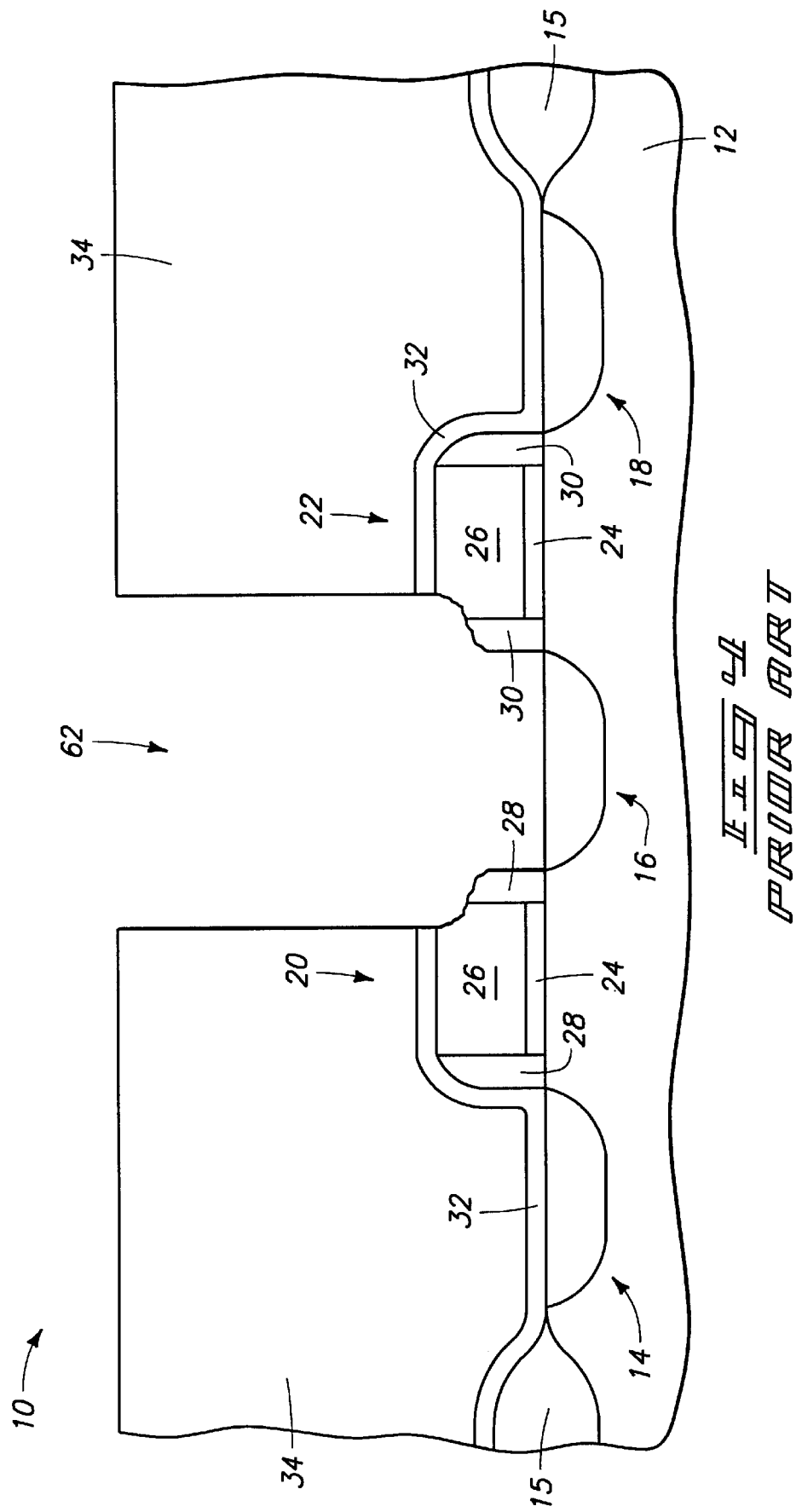
FIG. 4 is a view of the FIG. 2 wafer fragment at a processing step subsequent to that of FIG. 2 and alternative to the idealized processing step of FIG. 3.
Figure 6:
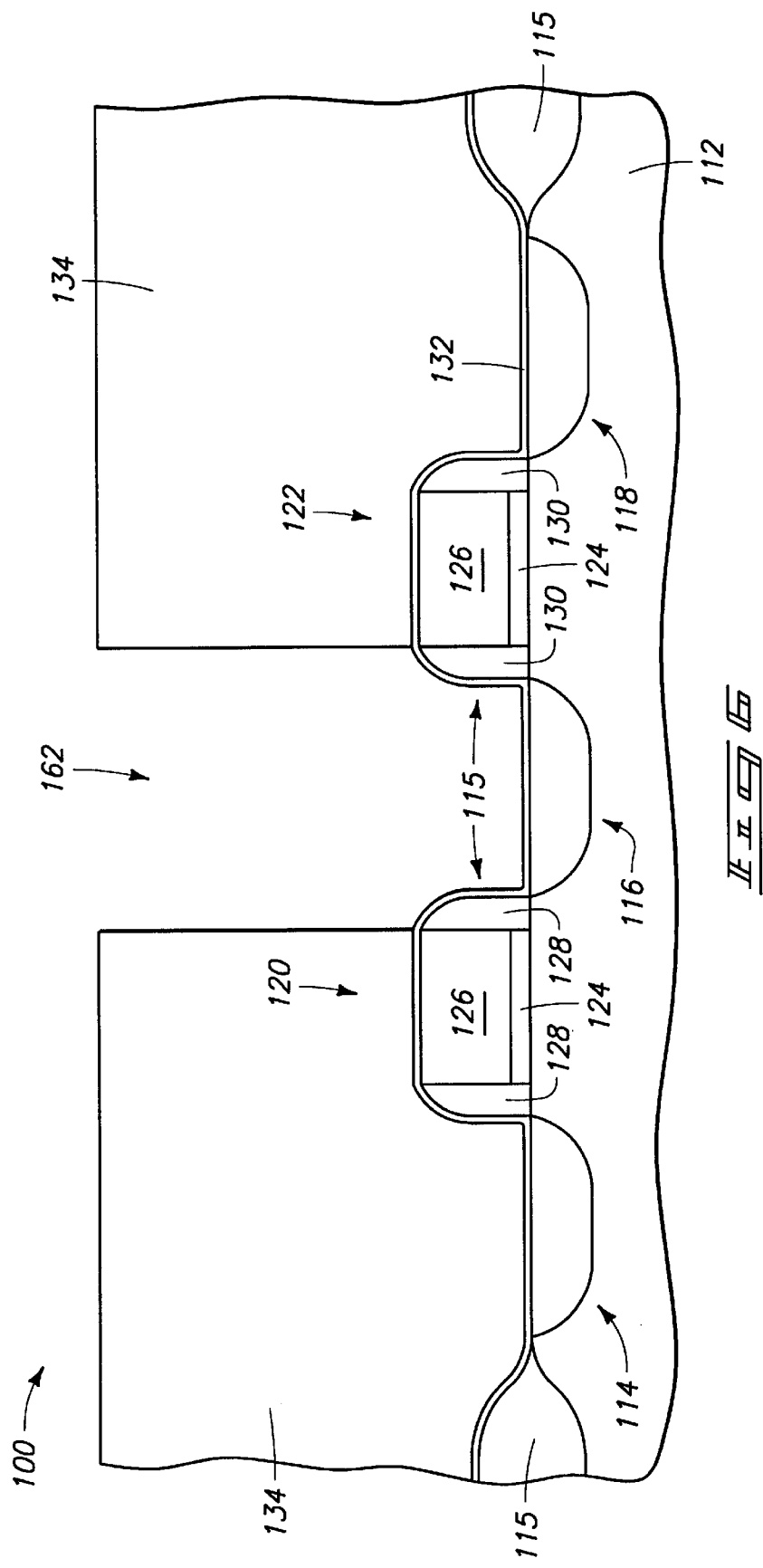
FIG. 6 is a view of the FIG. 5 wafer fragment at a processing step subsequent to that of FIG. 5.
Figure 7:
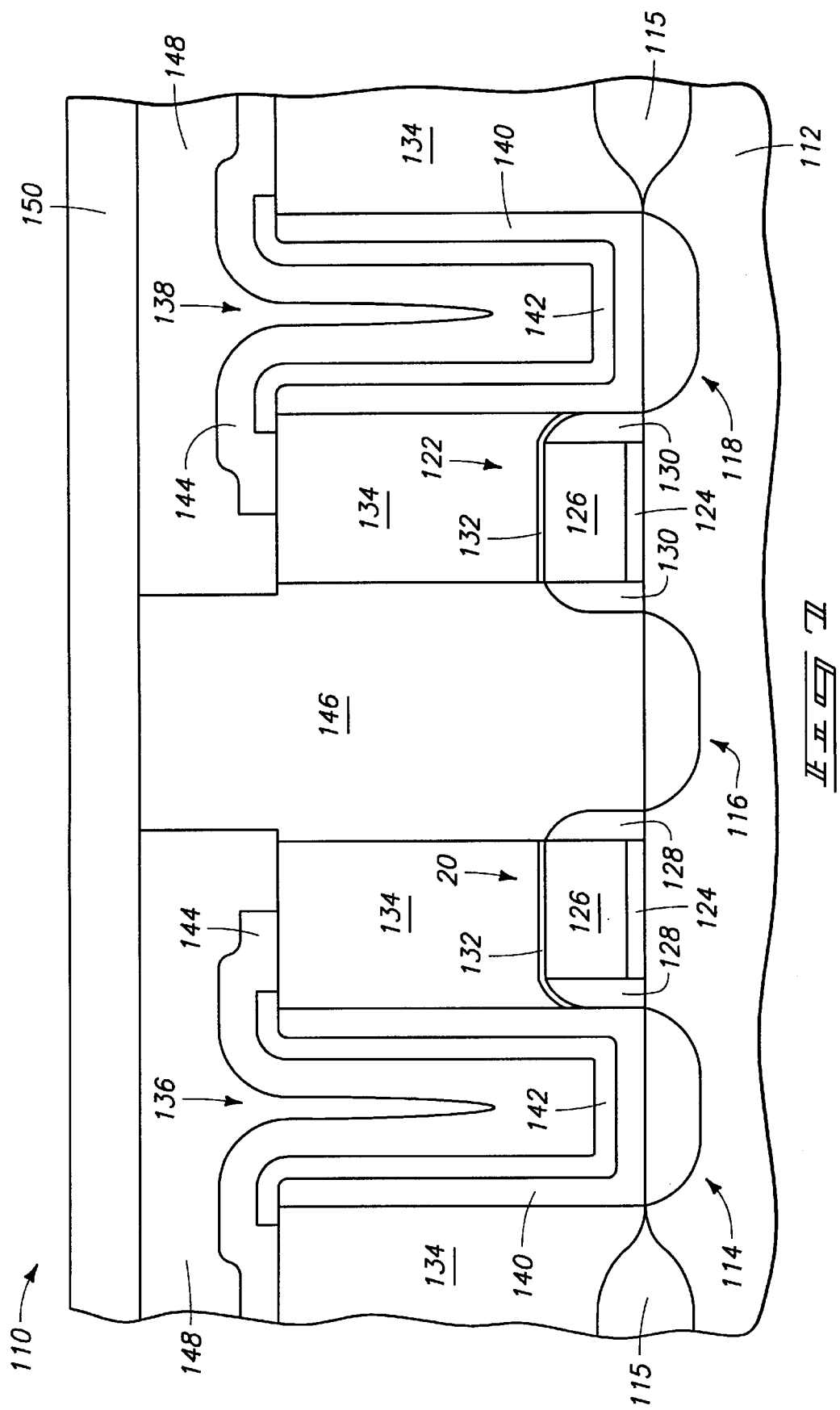
FIG. 7 is a view of the FIG. 5 wafer fragment at a processing step subsequent to that of FIG. 6.

Referring to FIG. 6, a layer of BPSG 134 is formed over silicon nitride layer 132 and an opening 162 is etched into BPSG layer 134 to stop at silicon nitride layer 132. Sides of opening 162 are aligned with portions 115 of nitride layer 132 that extend along sidewall spacers 128 and 130. BPSG layer 134 and opening 162 can be formed by methods discussed above with reference to FIGS. 2 and 3 in the background section of this disclosure. The carbon incorporated within silicon nitride layer 132 can provide a selectivity of the etch of BPSG material of layer 134 relative to the silicon nitride material of layer 132 to greater than 5:1, and preferably to greater than 10:1. Such selectivity can decrease a risk of the over-etch problems illustrated in FIG. 4 of the background section of this disclosure relative to the risk that exists with prior art methods. The decreased risk of over-etch problems accomplished by carbon incorporation within silicon nitride layer 132 enables layer 132 to be formed thinner than the etch stop layer 32 utilized in the prior art constructions of FIGS. 1–3. Accordingly, there can be more space above layer 132 for circuit constructions. Also, the incorporation of carbon within layer 132 enables etch selectivity to be obtained even if layer 134 is very thin before the etch. Specifically, layer 134 can be less than 1.3 microns thick before the etch and etch selectivity can still be obtained.

After the selective etch to expose nitride layer 132, further processing can be utilized to extend opening 162 to node 116. Such further processing can include a silicon nitride etch, such as, for example, hot phosphoric acid.

Subsequently, a bit line contact similar to the bit line contact 46 of prior art FIG. 1 can be formed within opening 162. Also, further processing can be conducted to form capacitor constructions similar to constructions 36 and 38 of prior art FIG. 1 to complete a DRAM structure from the construction of FIG. 6. Such DRAM structure is shown in FIG. 7, with components analogous to those of FIG. 1 labeled with integers 100 units larger than the integers utilized in FIG. 1. The DRAM structure of FIG. 7 comprises capacitor constructions 136 and 138. Such constructions comprise storage node layers 140, dielectric layers 142 and second electrodes 144. Capacitor constructions 136 and 138 can be larger than capacitor constructions 36 and 38 of FIG. 1, even though the DRAM construction of FIG. 8 occupies a same amount of wafer real estate as the DRAM construction of FIG. 1, due to increased area available by silicon nitride layer 132 being thinner than prior art silicon nitride layer 32 of FIG. 1.

Figure 8:
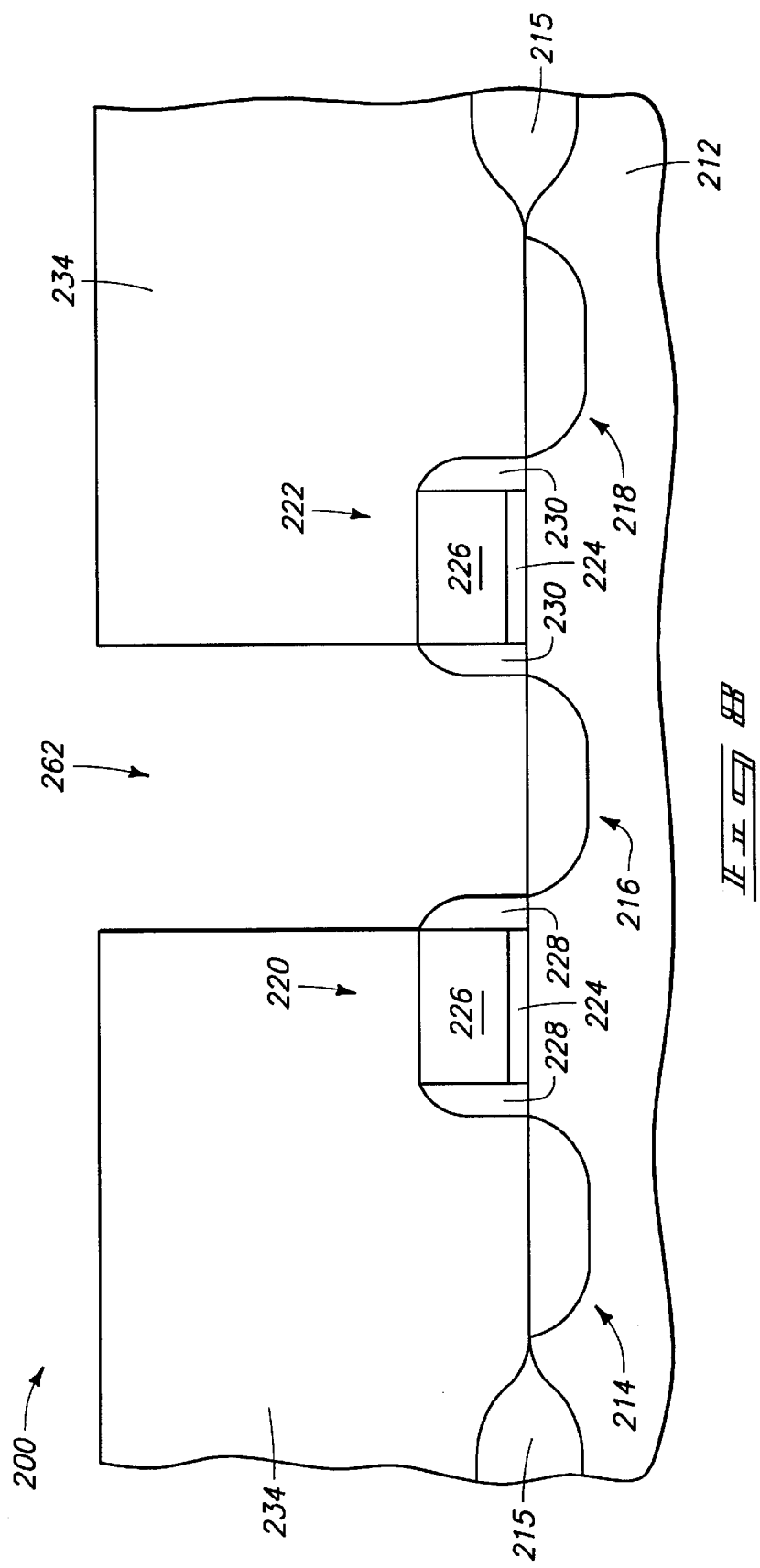
FIG. 8 is a diagrammatic, cross-sectional view of a semiconductor wafer fragment processed according to a second embodiment method of the present invention.

Another embodiment of the present invention is described with reference to FIGS. 8 and 9. Such embodiment comprises forming carbon within sidewall spacers to decrease an etch rate of the spacers relative to an overlying insulative layer. Referring to FIG. 8, a semiconductive wafer 200 comprises a substrate 212 and overlying wordlines 220 and 222. Node locations 214, 216 and 218 are between wordlines 220 and 222. Substrate 212, wordlines 220 and 222, and node locations 214, 216 and 218 can comprise constructions discussed in the background section of this embodiment for prior art substrate 12, wordlines 20 and 22, and node locations 14, 16, and 18, respectively.

Sidewall spacers 228 and 230 extend along sidewalls of wordlines 220 and 222, respectively. Spacers 228 and 230 comprise a material having carbon incorporated therein, and can comprise, for example, silicon nitride or silicon dioxide having carbon incorporated therein. Spacers 228 and 230 can also consist essentially of carbon and either silicon nitride or silicon oxide. Exemplary spacers 228 and 230 comprise silicon dioxide with carbon incorporated therein to a concentration of from about 2% to about 20% (by weight). Such spacers can be formed by, for example, chemical vapor deposition utilizing bis(tertiary butyl amino) silane and $NH_3$.

An insulative material 234 is formed over wordlines 220 and 222, and over spacers 228 and 230. Layer 234 can comprise, for example, BPSG. A difference between the construction of FIG. 8 and the prior art constructions of FIGS. 1-3 (discussed in the background section of this disclosure) is that the construction of FIG. 8 does not have an etch stop layer (shown as layer 32 in FIGS. 1-3) provided over wordlines 220 and 222.

An opening 262 is etched through layer 234 and to substrate 212. The opening is aligned relative to sidewalls 228 and 230 proximate substrate 212. In a particular aspect of the present invention, insulative layer 234 comprises BPSG and sidewalls 228 and 230 comprise silicon dioxide. In this aspect of the invention, a first silicon oxide layer (BPSG layer 234) is etched selectively relative to a second silicon oxide layer (the layer of one or both of spacers 228 and 230) by virtue of carbon incorporation into the second silicon oxide layer.

Figure 9:
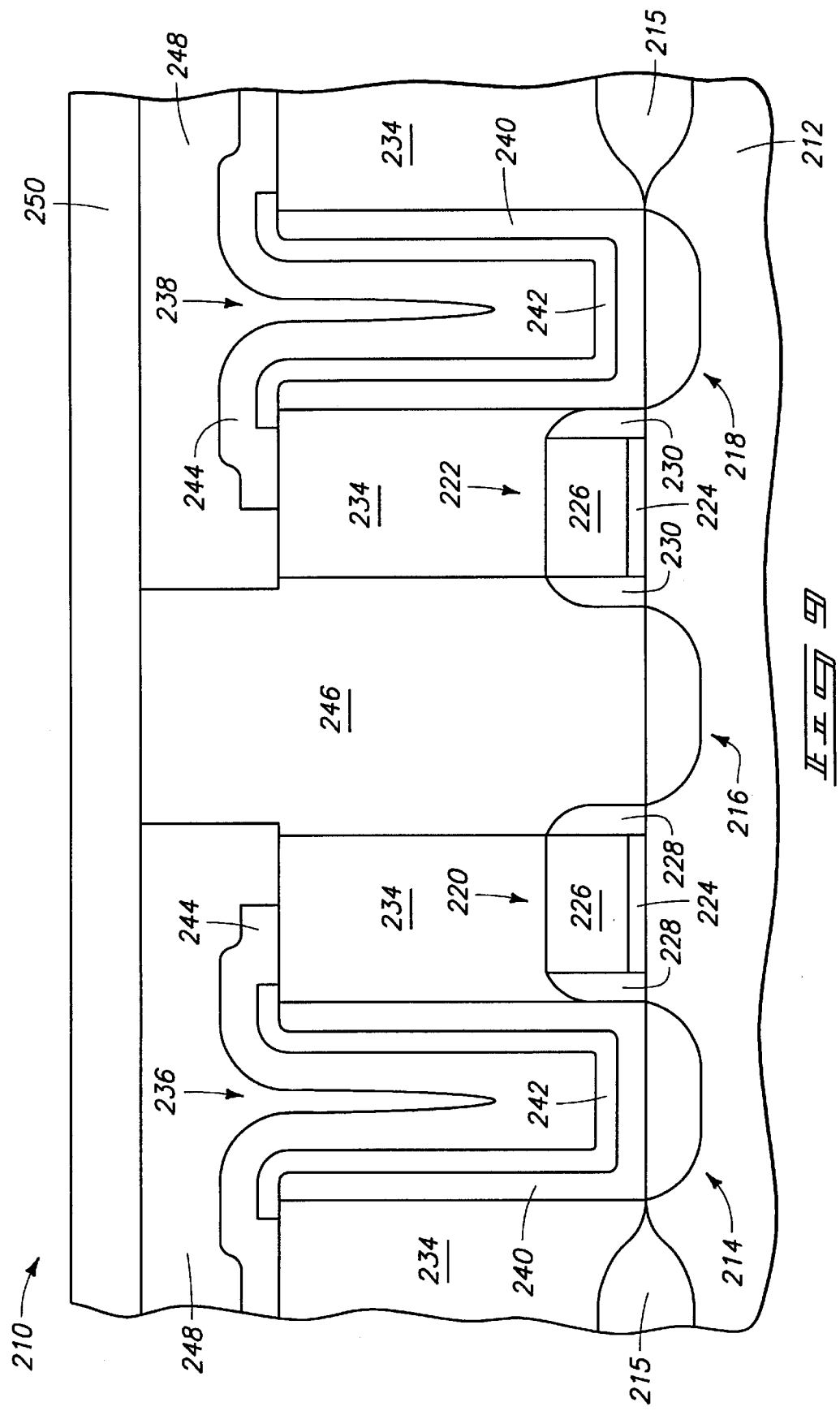
FIG. 9 is a view of the FIG. 8 wafer fragment at a processing step subsequent to that of FIG. 8.

Referring to FIG. 9, wafer fragment 200 can be processed according to methods similar to those discussed above with reference to FIG. 1 in the background section of the first invention to produce a DRAM construction. The DRAM construction of FIG. 9 is labeled similarly to that of FIG. 1, with components analogous to those of FIG. 1 labeled with integers 200 units larger than the integers utilized in FIG. 1.

The DRAM construction of FIG. 9 comprises capacitors 236 and 238. Capacitors 236 and 238 can be larger than the capacitors 36 and 38 of FIG. 1, even though the DRAM construction of FIG. 8 occupies a same amount of wafer real estate as the DRAM construction of FIG. 1, due to the elimination of an etch stop layer (the etch stop layer 32 of FIG. 1).

Further, even if an etch stop layer is present, sidewall spacers 128 and 130 can be thinner than prior art spacers 28 and 30 (FIG. 1) to provide additional room for capacitor constructions. Specifically, a function of the prior art sidewall spacers 28 and 30 can be to provide In a barrier in the event that protective layer 32 is etched through during processing to form opening 62 (FIG. 2). As the sidewall spacers 228 and 230 are more resistant to etch than prior art sidewall spacers 28 and 30, sidewall spacers 228 and 230 can be formed thinner than prior is art sidewall spacers 28 and 30 and still form an effective barrier against etch-through. For instance, prior art sidewall spacers 28 and 30 would typically be formed to a thickness of at least about 900 Å (the "thickness" being defined as an amount by which the spacers extend outwardly (horizontally in FIG. 1) from the sidewalls of the wordlines), and sidewall spacers 228 and 230 can be formed to a thickness of less than or equal to about 500 Å. The thinner sidewall spacers 228 and 230 can provide additional room for capacitor constructions 236 and 236 relative to the room available for capacitor constructions 36 and 38 of FIG. 1.

Figure 10:
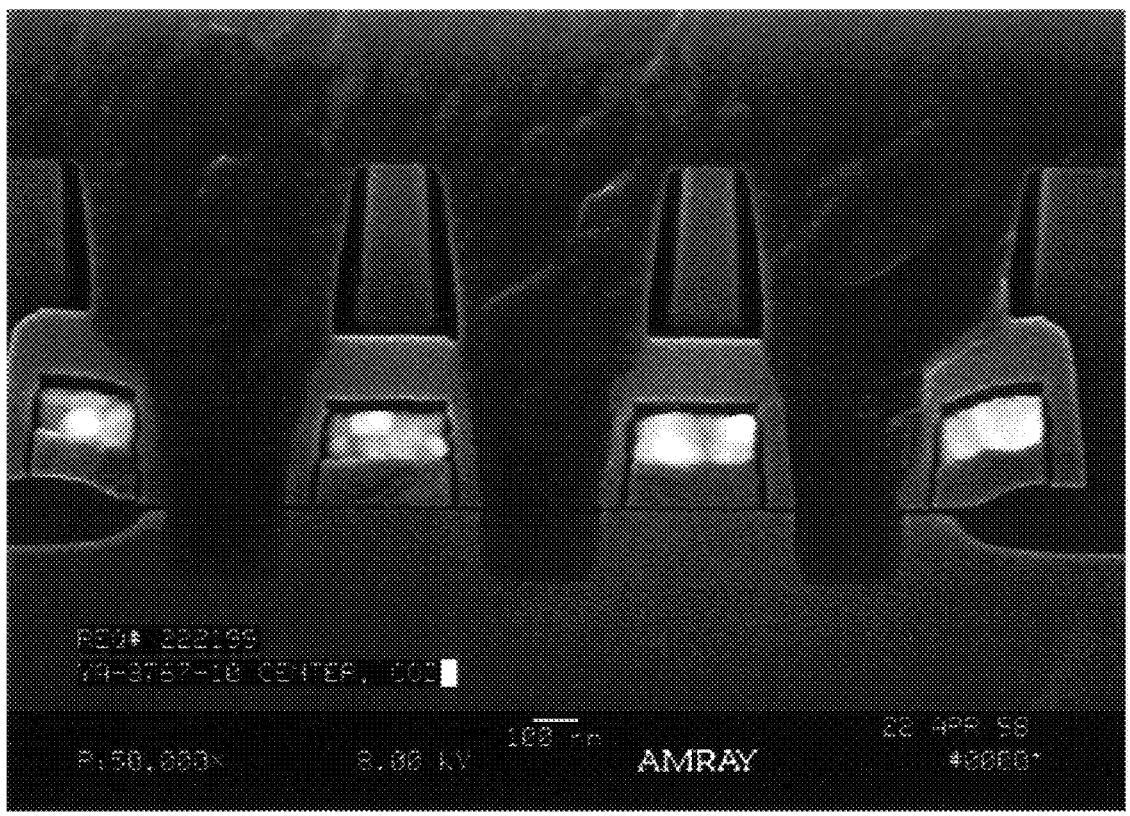
FIG. 10 is a scanning electron micrograph of a prior art semiconductor wafer fragment that has been subjected to an etching condition.

FIGS. 10 and 11 are scanning electron micrographs comparing a prior art semiconductor wafer fragment (FIG. 10) and a present invention semiconductor wafer fragment (FIG. 11) subjected to identical etching conditions. Specifically, FIG. 10 illustrates a wafer fragment comprising a sidewall spacer of silicon dioxide and having less than 2% carbon incorporated therein. In contrast, FIG. 11 illustrates a semiconductive wafer fragment comprising a sidewall spacer having greater than 2% carbon incorporated therein (specifically about 10%). As can be seen it in comparing FIGS. 10 and 11, the method of the present invention has significantly reduced etching into the sidewall spacer. In fact, no etching is apparent in the FIG. 11 semiconductive wafer processed according to a method of the present invention, whereas significant is sidewall etching is apparent in the prior art FIG. 10 semiconductive wafer fragment.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method for reducing an etch rate of a silicon-comprising material comprising:

forming the silicon-comprising material over a semiconductor substrate;

incorporating carbon into the silicon-comprising material to form a carbon-containing material, the carbon being incorporated into the silicon-comprising material to an amount wherein the carbon-containing material comprises from about 2% to about 20% carbon by weight;

wherein the silicon-comprising material is formed by CVD in a CVD reactor, and wherein the incorporating carbon comprises providing a carbon-containing gas in the CVD reactor during formation of the silicon-comprising material;

wherein the silicon-comprising material comprises silicon nitride; and wherein the carbon-containing gas comprises one or more of tetraethylorthosilicate, bis-(tertiary butyl amino) silane, methane, carbon dioxide, or carbon tetrachloride.

2. A method for reducing an etch rate of a silicon-comprising material, comprising:

forming the silicon-comprising material over a semiconductor substrate, the silicon-comprising material comprising silicon nitride; and incorporating carbon into the silicon-comprising material to form a carbon-containing material, the carbon being incorporated into the silicon-comprising material to an amount wherein the carbon-containing material comprises from about 2% to about 20% carbon, by weight.

* * * * *